US006373271B1

(12) United States Patent
Miller et al.

(10) Patent No.: US 6,373,271 B1
(45) Date of Patent: Apr. 16, 2002

(54) SEMICONDUCTOR WAFER FRONT SIDE PRESSURE TESTING SYSTEM AND METHOD THEREFOR

(75) Inventors: Todd F. Miller, Phoenix; Ronald P. Bieschke, Mesa, both of AZ (US); Gary J. O'Brien, Ann Arbor, MI (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/474,438

(22) Filed: Dec. 29, 1999

(51) Int. Cl.$^7$ ............................................... G01R 31/02
(52) U.S. Cl. ...................................................... 324/760
(58) Field of Search .................................. 324/765, 754, 324/537, 760, 703; 165/46, 80.1, 80.2, 80.3; 174/15.2; 257/719; 361/700; 269/21; 279/3

(56) References Cited

U.S. PATENT DOCUMENTS 4,777,716 A * 10/1988 Folk et al. ..................... 29/593
5,346,513 A * 9/1994 Taniguchi et al. ......... 29/25.01

OTHER PUBLICATIONS

"An Automatic Measurement System for Electromechanical Characterization of Silicon Pressure Sensors", Gong et al., IEEE Transactions on Instruments and Measurement, vol. 45, No. 1, Feb. 1996, pp. 184–189.

* cited by examiner

Primary Examiner—Safet Metjahic
Assistant Examiner—Etienne LeRoux
(74) Attorney, Agent, or Firm—Lanny Parker; Robert A. Rodriguez

(57) ABSTRACT

An apparatus and method is disclosed for a semiconductor wafer front side pressure testing system (200, 300, 400). Negative or positive pressure is applied to the top portion of a semiconductor wafer (216, 316) mounted on a support structure or wafer chuck (222, 322, 422). In one embodiment, bellows (232) coupled to the wafer chuck (222, 322, 422) and a platen (218, 318, 418) located above the semiconductor wafer (216, 316) provides a sealed atmosphere above the semiconductor wafer (216, 316) to permit negative or positive pressure to be introduced into this sealed atmosphere. In another embodiment, a seal is provided by a wall portion (421) connected to the chuck (422) contacting a gasket (419) located beneath the platen (418).

15 Claims, 2 Drawing Sheets

SEMICONDUCTOR WAFER FRONT SIDE PRESSURE TESTING SYSTEM AND METHOD THEREFOR

FIELD OF THE INVENTION

This invention relates, in general, to wafer probe systems and methods therefor and, more specifically, to a semiconductor wafer front side pressure testing system and method therefor.

BACKGROUND OF THE INVENTION

As surface micromachining replaces bulk micromachining, it has become more important in semiconductor device manufacture to provide a higher percentage of "known good die" for increasing yield and for reducing costs in final manufacturing. This is important as the final manufacturing stage, including the processing of the wafer into a multitude of individually packaged devices, is one of the most expensive areas in semiconductor production. The packaging and post-package testing costs make it very advantageous to test a semiconductor chip or device prior to the packaging stage, and ideally, each device would be fully functionally tested prior to packaging. The testing step, normally performed during a wafer probe operation, is ideally suited for electrical testing as the probe pads are all accessible on the surface of a wafer held on its backside by a vacuum chuck.

Some devices on a wafer, however, are not purely electronic in nature, but instead are designed to register or measure physical or environmental conditions. These conditions may include, for example, acceleration, temperature, and pressure. Thus, it is also desirable to be able to functionally test these physical effect devices prior to the packaging stage.

Hence a need exists for a method and apparatus capable of testing semiconductor devices in wafer form while they are being exposed to physical conditions such as pressure changes.

DETAILED DESCRIPTION OF THE DRAWINGS

Figure 1:
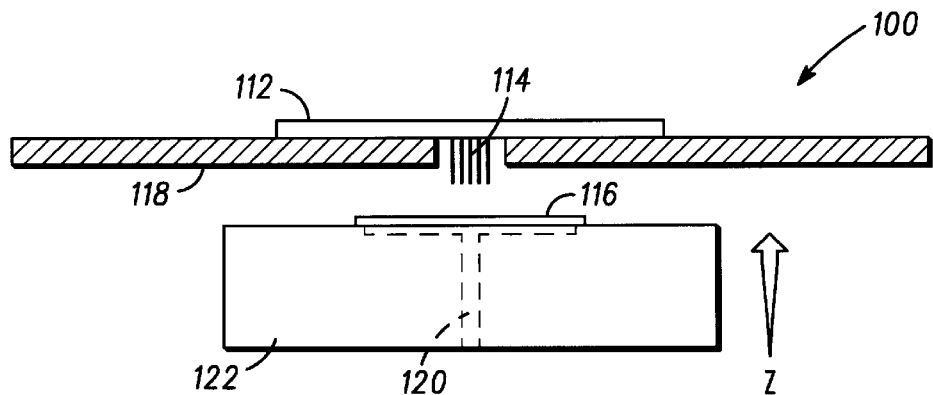
FIG. 1 is a side elevational view of a standard wafer probe assembly of the prior art.

FIG. 1 is an elevational view of a prior art wafer probe system 100. Wafer probe system 100 comprises a support structure such as, for example, a wafer chuck 122, having a vacuum source opening 120 through its center to permit connection to a vacuum source (not shown). Vacuum source opening 120 when coupled to the vacuum source provides the adhesion to hold a wafer 116 securely to wafer chuck 122. During the probing operation, wafer chuck 122 moves upward and downward along the Z axis (of the Cartesian coordinate system) by mechanical means (not shown) coupled to wafer chuck 122. This brings electrical probe needles 114, located on a probe card 112 mounted on a platen 118, into contact with device pads (not shown) located on wafer 116 and enables the electrical testing of the devices integral to wafer 116.

In the event that the devices to be tested in wafer 116 are physical effect measurement devices, such as pressure sensitive devices, the current procedure is to use a negative pressure through vacuum source opening 120 holding wafer 116. The vacuum, applied as it is, to the backside of the device located in wafer 116, is, unfortunately, of limited value. The applied vacuum is constrained by the requirements of adequately holding wafer 116 to wafer chuck 122, and because the vacuum is applied to the backside of wafer 116, front side devices are tested by simulation instead of by direct stimulation.

Figure 2:
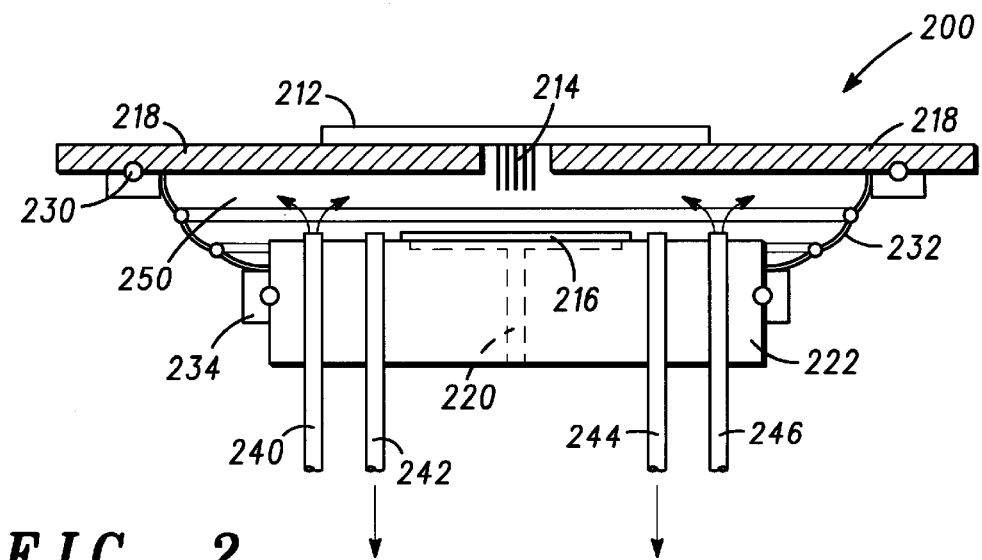
FIG. 2 is a side elevational view of a front side wafer probe system in accordance with an embodiment of the present invention.

FIG. 2 is a side elevational view of a front side wafer probe system 200 in accordance with an embodiment of the present invention. Front side wafer probe system 200 utilizes a flexible ringed bellows 232 located between a wafer chuck 222 and a platen 218. Front side wafer probe system 200 comprises wafer chuck 222, having a vacuum source opening 220 through its center. A vacuum source (not shown) coupled to the vacuum source opening 220 provides the adhesion to hold a wafer 216 securely to wafer chuck 222.

A feature of the present invention is its ability to stimulate the front side of wafer 216, i.e., the side of the wafer in which semiconductor devices are manufactured. In order to achieve this, front side wafer probe system 200 features an isolated test environment 250 or sealed chamber that is comprised of a sealing mechanism that includes a ringed bellows 232 in combination with O-ring seals 230 and 234 that form a pressure boundary with platen 218 and wafer chuck 222. Ringed bellows 232 allows relative movement between wafer chuck 222 and platen 218 during testing and processing without a pressure change in the isolated test environment 250, i.e., movement along the X, Y, and Z axes of the Cartesian coordinate system.

Ringed bellows 232 is advantageous as it allows for both the use of high pressure in isolated test environment 250 and movement in the X-Y plane by wafer chuck 222. To allow testing of a specified die on the semiconductor wafer, ringed bellows 232 should allow movement to the edge of the semiconductor wafer, i.e., half the size of the semiconductor wafer. For example, as much as ±7.62 centimeters (cm) of movement for a 150 millimeter (6 inch) wafer would be allowed in an exemplary embodiment of the present invention. The actual movement provided for is a function of the size of wafer 216, the number of die to be tested that are located in wafer 216, the geometry of the bond pads (not shown) on wafer 216, the number and location of probe needles 214, etc. Thus, those skilled in the art will recognize that although ±7.62 cm is discussed hereinbefore, this is purely an exemplary number not meant to be limiting to the spirit and scope of the present invention.

Ringed bellows 232 also allows increased throughput due to the ability of ringed bellows 232 to accommodate the X-Y and Z planes movement of wafer chuck 222 while maintaining the seal during this movement. A probe card 212 is also part of the pressure boundary that is formed between wafer chuck 222 and platen 218 as it is sealed to platen 218. This pressure boundary is helped by a smaller opening in platen 218. It should be noted, although not shown herein, that, alternatively, platen 218 and probe card 212 may be a single or an integral item thus removing the sealing requirement between platen 218 and probe card 212 if they were separate, individual items.

Front side wafer probe system 200 further comprises multistage pressure inlet tubes 240 and 246 and pressure sense tubes 242 and 244 coupled through wafer chuck 222. It should be understood that an inlet tube in combination with a pressure sense tube forms a stage of probe system 200. Thus, a two stage probe system is a multistage probe system that has two inlet tubes in combination with two corresponding pressure sense tubes. Multistage probe systems have at least two inlet tubes in combination with corresponding pressure sense tubes. Pressure sense tubes 242 and 244 are used for synchronous pressure measurements. The use of two different pressure inlet tubes 240 and 246 and pressure sense tubes 242 and 244 allows for a faster pressurization cycle time which is advantageous as it results in a shorter production cycle. The multistage pressure system allows the pre-staging of either pressure or vacuum which may be instantly ported, either both stages at once, or sequentially, to isolated test environment 250. Additionally, vacuum, or low pressures may also be ported to isolated test environment 250. The front side positive or negative pressure to wafer 216 is applicable for both differential and absolute pressure sensors. Additionally, isolated test environment 250 facilitates: verifying the span of absolute and differential pressure sensors, reliability testing, eliminating package effects for parametric characterization, and the detection of cavity breakage including moderate to gross leakage, and unreleased diaphragms. It should be noted that more than two stages of pressure/vacuum may be used in the present invention, and the two stages discussed herein are meant to be exemplary in nature and not limiting to the spirit or scope of the present invention.

In operation, wafer 216 is placed on wafer chuck 222 in a manner well known to those skilled in the art. Following the X-Y positioning of wafer 216 and application of vacuum from the vacuum source (not shown) through vacuum source opening 220 to the backside of wafer 216, wafer chuck 222 is moved upward in the Z direction by means of a vertical drive assembly (not shown) coupled thereto. A seal is formed between vacuum chuck 222 and platen 218 by O-rings 230 and 234, thereby establishing isolated test environment 250. Wafer chuck 222 is now moved upward in the Z direction to allow contact between probe needles 214 and the bond pads (not shown herein) of the wafer 216 undergoing test. The multi-stage pressure system may now admit high pressure through pressure inlet tube 240 accompanied by pressure sensing through pressure sense tube 242. Thus, a front side positive pressure stimulation of the device under test in wafer 216 has occurred. Following any required pressure equalization, a second cycle, or application of pressure/vacuum and pressure sense may now occur via pressure inlet tube 246 and pressure sense tube 244.

Next, wafer chuck 222 may be moved down in the minus Z direction and repositioned in the X-Y plane to bring another device's bond pads into position for contact by probe needles 214. Wafer chuck 222 is again raised and the desired pressure/vacuum cycle is performed. It should be noted that the types of pressure/vacuum cycles are variable as desired by the user and the spirit and scope of the present invention is not meant to be limited herein. Furthermore, as previously stated, more than a single die may be tested at a time if there are a sufficient number of probe needles 214 to accommodate the desired number of die.

Figure 3:
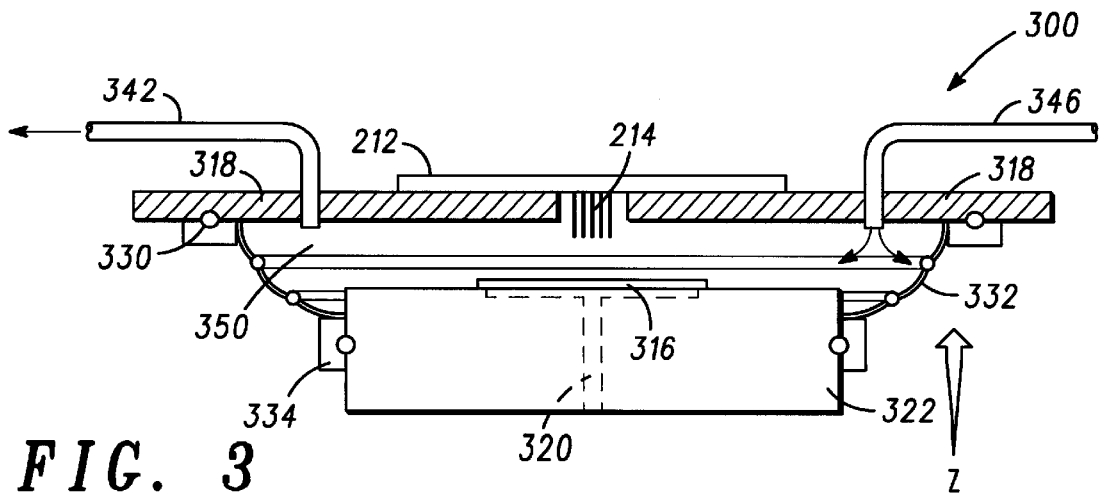
FIG. 3 is a side elevational view of a front side wafer probe system in accordance with another embodiment of the present invention.

FIG. 3 is a side elevational view of a front side wafer probe system 300 in accordance with another embodiment of the present invention. This alternate embodiment utilizes a ringed bellows 332 between a wafer chuck 322 and a platen 318. As before, front side wafer probe system 300 comprises a wafer chuck 322 having a vacuum source opening 320 through its center. Also featured is an isolated test environment 350 comprised of ringed bellows 332 in combination with O-ring seals 330 and 334 forming a pressure boundary with platen 318 and wafer chuck 322. In this embodiment, however, front side wafer probe system 300 further comprises multistage pressure inlet tube 346 and pressure sense tube 342 coupled through platen 318 instead of through wafer chuck 322. As before, additional stages of pressure inlet and pressure sense may be incorporated without departing from the spirit or scope of the present invention. This alternate embodiment provides for a smaller wafer chuck area, or alternatively, a larger wafer 316. The strength of ringed bellows 332 is a function of its size and, as the size of wafer 316 increases, it may be advantageous to couple pressure inlet tube 346, pressure sense tube 342, and other desired exhaust tubes or instrumentation (not shown herein) through platen 318. Coupling inlet tube 346 and pressure sense tube 342 through platen 318 instead of through wafer chuck 322 may aid in minimizing the physical demands upon ringed bellows 332.

As previously discussed, the other features concerning the probe card, types of pressure/vacuum, etc. are equally applicable to this embodiment.

Figure 4:
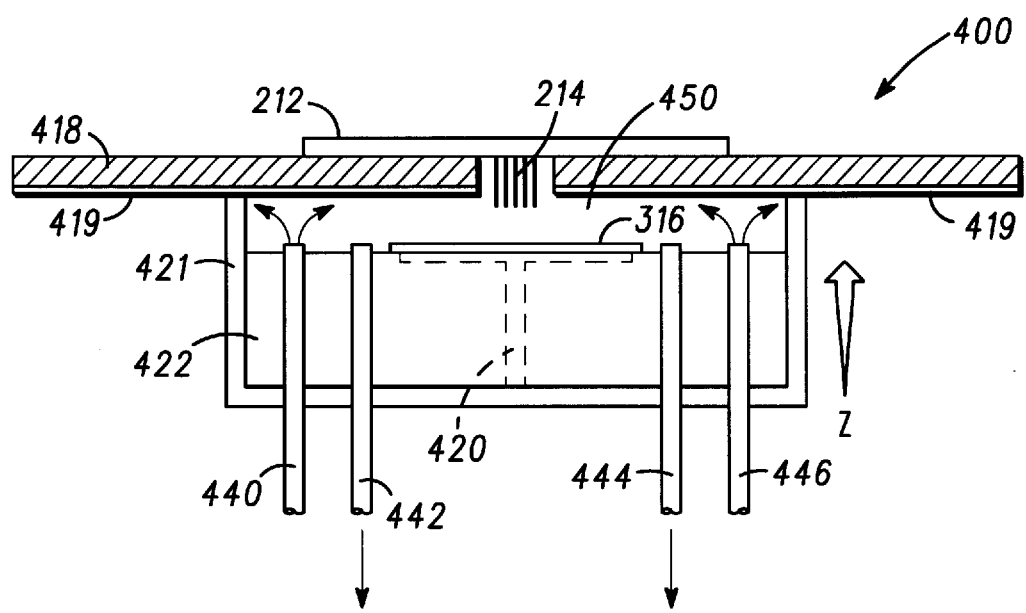
FIG. 4 is a side elevational view of a front side wafer probe system in accordance with yet another embodiment of the present invention.
Figure 5:
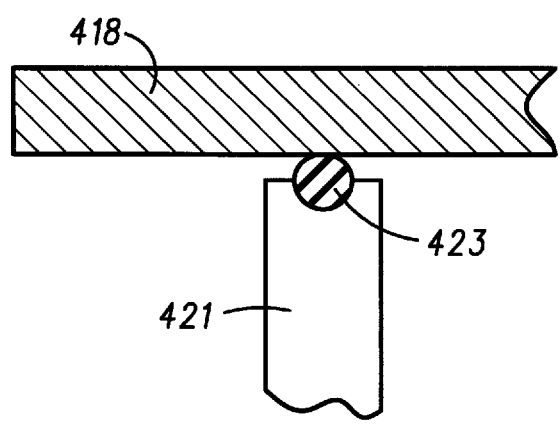
FIG. 5 is a side elevational view of a front side wafer probe system in accordance with yet another embodiment of the present invention.

FIG. 4 is a side elevational view of a front side wafer probe system 400 in accordance with yet another embodiment of the present invention. This embodiment utilizes a direct gasket seal 419 (located between wafer chuck 422 and platen 418). As before, front side wafer probe system 400 comprises a wafer chuck 422 having a vacuum source opening 420 through its center. However, in this embodiment, ringed bellows 232 and 332 of FIGS. 2 and 3, respectively, is replaced with a rigid pressure wall 421 and direct gasket seal 419. Annular or encircling rigid pressure wall 421 is coupled or, if desired, is integral to wafer chuck 422. Platen 418 has its gasket 419 preferably affixed to its underside. Thus, gasket 419 serves as a sealing member that is adapted to establish a pressure seal between an underside of platen 418 and an upper rim edge of rigid pressure wall 421. As wafer chuck 422 moves upward in the Z direction, the upper rim of pressure wall 421 will contact gasket 419 and establish a seal, resulting in an isolated test environment 450. It should also be noted, with reference to FIG. 5, that rather than the gasket 419, an O-ring 423 may also be used to establish the seal between platen 418 and pressure wall 421.

Pressure wall 421 can, if desired, be independently movable in relation to the side wall of wafer chuck 422, either positioned internal relative to the side wall of wafer chuck 422, or external relative to the side wall of wafer chuck 422, which allows more Z direction variations in installation and sealing against gasket 419. The particular configuration may require a seal between pressure wall 421 and wafer chuck 422.

If desired, pressure wall 421 may be integral to the side wall of wafer chuck 422 in order to minimize the number of pressure boundary seals required. In this embodiment, platen 418 must be large enough to accommodate the full X-Y plane movement of wafer chuck 422. This embodiment may be structurally advantageous as only one seal using gasket 419 or O-ring 423 is used. Also, this embodiment allows higher pressures ranges in isolated test environment 450 due to the relatively rigid pressure wall 421. Pressure inlet tubes 440 and 446 and pressure sense tubes 442 and 444 may be either coupled through wafer chuck 422 or through platen 418, although, for this embodiment, coupling through wafer chuck 422 is more desirable. It should be noted that, as this embodiment does not allow X-Y plane movement while the isolated test environment 450 is pressurized, the cycle time may increase due to the increased requirement to rapidly exhaust and repressurize isolated test environment 450 to accommodate an X-Y plane movement of wafer chuck 422.

As previously discussed, the other features concerning the probe card, types of pressure/vacuum, etc. are equally applicable to this alternate embodiment.

It should be noted that although not shown, the systems of the present invention may also include additional features such as pressure sense and relief lines or instrumentation as may be desired to be incorporated therein without departing from the spirit or scope or the present invention.

While the invention has been particularly shown and described with reference to the preferred embodiments thereof, it will be understood by those skilled in the art that the foregoing and other changes in form, and details may be made therein without departing from the spirit and scope of the invention. For example, bonding agents, clamps, welds, or the like can be used to form the seal rather than using O-rings. Moreover, the probe needles can be moved toward the wafer chuck rather than moving the wafer chuck toward the probe card. Other components that may be used to create the sealed environment include any structure within, around or containing the prober or any structure within the prober such as, for example, the platen, loadboard, probe card, or the like.

What is claimed is:

1. An apparatus for providing pressure to a front side of a semiconductor wafer, comprising:
    a wafer chuck;
    a platen; and
    a bellows having a first end and a second end opposite the first end, wherein said bellows extends between said wafer chuck and said platen, and wherein said first end abuts a surface affixed to the wafer chuck and said second end abuts a surface affixed to the platen thereby defining a test environment for the semiconductor wafer, wherein an internal pressure within said test environment is different than an external pressure without said test environment, and wherein said bellows allows for horizontal and vertical movement between said wafer chuck and said platen during processing of said semiconductor wafer without exposing said front side of said semiconductor wafer to said external pressure.

2. The apparatus of claim 1 further comprising at least one pressurization member coupled to said test environment and adapted to provide at least one of a positive and a negative pressure to said test environment.

3. The apparatus of claim 2 wherein said at least one pressurization member comprises a pressure inlet opening ported through said wafer chuck.

4. The apparatus of claim 2 wherein said at least one pressurization member comprises a pressure inlet opening ported through said platen.

5. The apparatus of claim 1 wherein said bellows is further characterized as a flexible ringed bellows that includes at least one O-ring in contact with at least one of the first end and the second end.

6. The apparatus of claim 5 further comprising at least one pressurization member coupled to said test environment and adapted to provide at least one of a positive and a negative pressure to said test environment.

7. The apparatus of claim 6 wherein said at least one pressurization member comprises a pressure inlet opening ported through said wafer chuck.

8. The apparatus of claim 6 wherein said at least one pressurization member comprises a pressure inlet opening ported through said platen.

9. The apparatus of claim 1 including a probe card coupled to said platen and having a set of probe needles extending through said platen.

10. A method for providing pressure to a front side of a semiconductor wafer comprising the steps of:
    placing said semiconductor wafer on a wafer chuck within a test environment that includes a probe card and a bellows, wherein said bellows extends between a surface affixed to said probe card and a surface affixed to said wafer chuck;
    pressurizing said test environment to define an internal pressure within said test environment, wherein said internal pressure is different from an external pressure without said test environment, and wherein said front side of said semiconductor wafer is exposed to said internal pressure;
    electrically contacting a first die on said semiconductor wafer with probe needles extending from said probe card; and
    electrically contacting a second die after electrically contacting the first die without exposing said front side of said semiconductor wafer to said external pressure.

11. The method of claim 10, wherein the probe card includes a platen coupled thereto.

12. The method of claim 10 further comprising the step of monitoring said internal pressure within said test environment.

13. The method of claim 12 further comprising venting said test environment to said external pressure.

14. The method of claim 10 further comprising changing a pressure within said test environment in at least one of a selected positive and a negative value relative to said internal pressure.

15. The method of claim 14 further comprising the step of monitoring said pressure within said test environment.

\* \* \* \* \*